United States Patent
Choksi et al.

(10) Patent No.: US 9,608,574 B2
(45) Date of Patent: Mar. 28, 2017

(54) PORT ISOLATION IN SHARED TRANSFORMERS

(71) Applicant: QUALCOMM Incorporated, San Diego, CA (US)

(72) Inventors: Ojas M Choksi, San Diego, CA (US); Himanshu Khatri, Laguna Niguel, CA (US); Faramarz Sabouri, San Diego, CA (US); Wei Zhuo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 755 days.

(21) Appl. No.: 13/773,449

(22) Filed: Feb. 21, 2013

(65) Prior Publication Data

US 2014/0139042 A1     May 22, 2014

Related U.S. Application Data

(60) Provisional application No. 61/728,174, filed on Nov. 19, 2012.

(51) Int. Cl.
　　*H03F 1/26*　　　(2006.01)
　　*H04B 1/18*　　　(2006.01)
　　*H01F 29/00*　　(2006.01)

(52) U.S. Cl.
　　CPC .............. *H03F 1/26* (2013.01); *H01F 29/00* (2013.01); *H04B 1/18* (2013.01); *Y10T 307/74* (2015.04)

(58) Field of Classification Search
　　CPC ....................................................... H02J 7/025
　　(Continued)

(56) References Cited

U.S. PATENT DOCUMENTS 6,225,874 B1 * 5/2001 Kerley ................ H03K 17/007
　　　　　　　　　　　　　　　　　　　　　　　333/104
8,044,540 B2    10/2011 Lee et al.
　　　　　(Continued)

FOREIGN PATENT DOCUMENTS

CN　　　　2845325 Y　　12/2006
CN　　　101611556 A　　12/2009
　　　　　(Continued)

OTHER PUBLICATIONS

Application as Filed in U.S. Appl. No. 13/645,265, Zhou Wei, a single-ended receiver with a multi-port transformer and shared mixer, Oct. 4, 2012.

(Continued)

*Primary Examiner* — Robert Deberadinis
(74) *Attorney, Agent, or Firm* — Liberty E. Mann

(57) ABSTRACT

Techniques for improving performance of a transformer shared amongst a plurality of operating modes. In an aspect, first and second primary windings of a transformer are coupled to an AC ground voltage. Primary windings are mutually coupled to a secondary winding of the transformer. To render the second primary winding inactive, e.g., when operating in a first mode, a switch coupling the second primary winding to the common reference voltage is opened. Similarly, when it is desired to render the first primary winding inactive, e.g., when operating in a second mode, a switch coupling the first primary winding to the common reference voltage is opened. In this manner, the inactive primary winding advantageously does not load the secondary winding. Further aspects provide for, e.g., extending the techniques to more than two modes, and alternative techniques to mutually couple the signal from the primary to the secondary winding.

23 Claims, 15 Drawing Sheets

(58) Field of Classification Search
USPC .......................................................... 307/112
See application file for complete search history.

(56) References Cited

U.S. PATENT DOCUMENTS

| | | |
|---|---|---|
| 8,270,499 B2 | 9/2012 | Chang et al. |
| 2006/0270377 A1 | 11/2006 | Bhatti et al. |
| 2008/0139149 A1 | 6/2008 | Mu et al. |
| 2008/0258703 A1* | 10/2008 | Makino .................. H02M 5/12 323/355 |
| 2011/0299431 A1 | 12/2011 | Mikhemar et al. |
| 2011/0299437 A1 | 12/2011 | Mikhemar et al. |
| 2012/0256702 A1 | 10/2012 | Khlat et al. |

FOREIGN PATENT DOCUMENTS

| | | |
|---|---|---|
| CN | 102124645 A | 7/2011 |
| JP | 2005109039 A | 4/2005 |
| WO | WO-2010132870 | 11/2010 |

OTHER PUBLICATIONS

Cassan, et al., "A 1-V Transformer-Feedback Low-Noise Amplifier for 5-GHz Wireless LAN in 0.18-μm CMOS", IEEE Journal of Solid-State Circuits, vol. 38, No. 3, Mar. 2003, pp. 427-435.
J.J. Zhou, D.J. Allstot, "Monolithic Transformers and Their Application in a Differential CMOS RF Low-Noise Amplifier," IEEE Journal of Solid-state Circuits, vol. 33, No. 12, Dec. 1998.
International Search Report and Written Opinion—PCT/US2013/070844—ISA/EPO—Feb. 10, 2014.

* cited by examiner

PORT ISOLATION IN SHARED TRANSFORMERS

CLAIM OF PRIORITY UNDER 35 U.S.C. §119

The present Application for patent claims priority to Provisional Application No. 61/728,174 entitled "Port isolation with shared transformer" filed Nov. 19, 2012, and assigned to the assignee hereof and hereby expressly incorporated by reference herein.

BACKGROUND

Field

The disclosure relates to transformers for electronic circuitry.

Background

Wireless transceivers commonly incorporate circuitry for operating in a plurality of modes. For example, a radio-frequency (RF) receiver may include a first low-noise amplifier (LNA) for receiving a first frequency band, and a second low-noise amplifier for receiving a second frequency band. The outputs of the LNA's may each drive an inductive load, e.g., first and second primary windings, respectively, of a transformer, and the inductive loads may further be mutually coupled to a secondary winding of the transformer. The secondary winding may generate a differential signal for further processing by a down-conversion mixer, which may be shared between the two frequency bands.

In a typical implementation, if only one frequency band is processed at a time, the first LNA may be active when the second LNA is inactive. Even when the second LNA is inactive, however, the second primary winding is still mutually (magnetically) coupled to the secondary winding of the transformer. This mutual coupling may undesirably attenuate and/or add noise to the signal coupling between the first primary winding and the secondary winding when the first LNA is active. A similar phenomenon occurs when the second LNA is active and the first LNA is inactive. The additional attenuation and noise introduced by these effects degrade the performance of the multi-band transceiver.

It would be desirable to provide techniques for improving the performance of transformers accommodating multiple modes in wireless transceivers.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The detailed description set forth below in connection with the appended drawings is intended as a description of exemplary aspects of the invention and is not intended to represent the only exemplary aspects in which the invention can be practiced. The term "exemplary" used throughout this description means "serving as an example, instance, or illustration," and should not necessarily be construed as preferred or advantageous over other exemplary aspects. The detailed description includes specific details for the purpose of providing a thorough understanding of the exemplary aspects of the invention. It will be apparent to those skilled in the art that the exemplary aspects of the invention may be practiced without these specific details. In some instances, well-known structures and devices are shown in block diagram form in order to avoid obscuring the novelty of the exemplary aspects presented herein. In this specification and in the claims, the terms "module" and "block" may be used interchangeably to denote an entity configured to perform the operations described.

Figure 1:
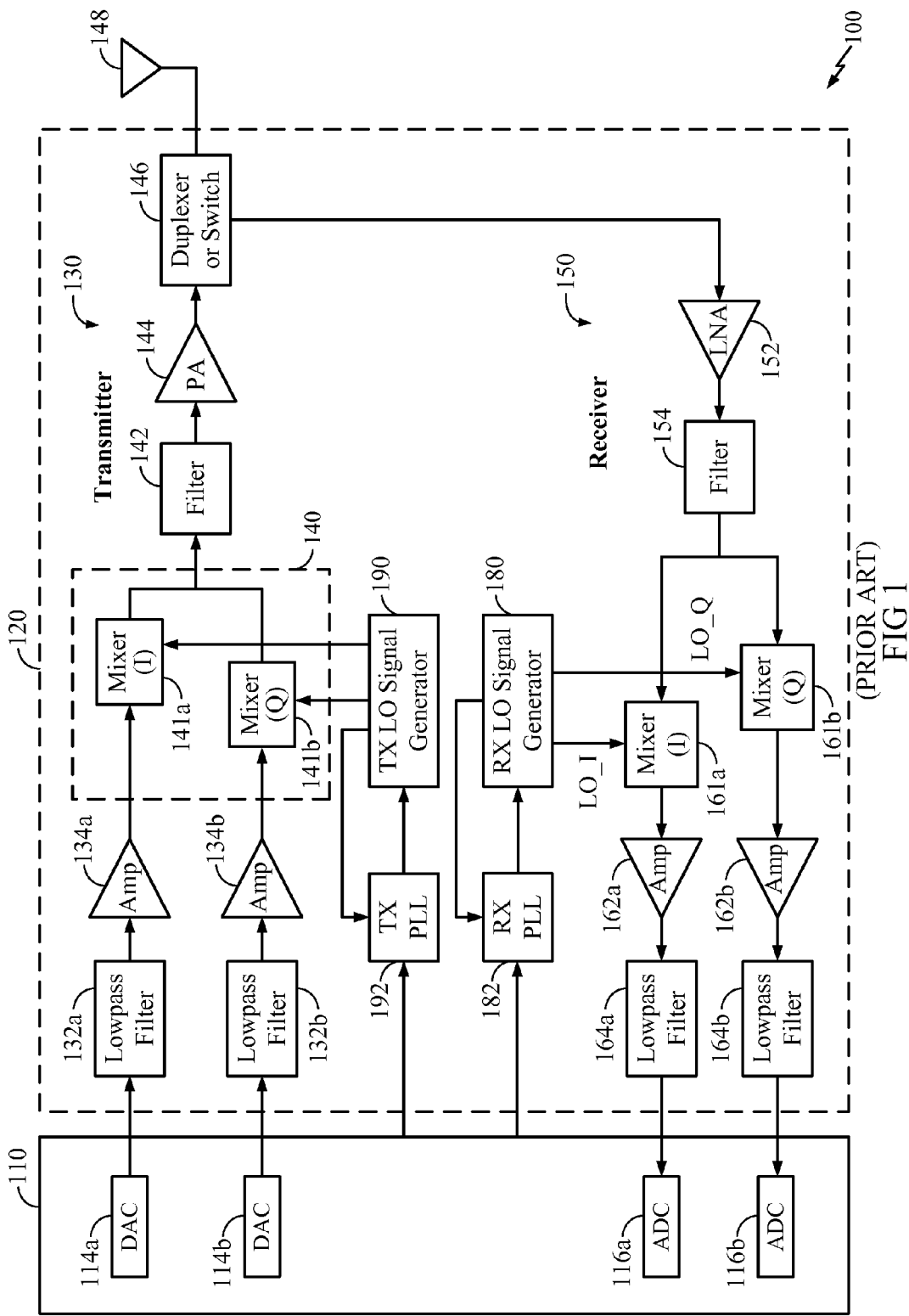
FIG. 1 illustrates a block diagram of a design of a prior art wireless communication device in which the techniques of the present disclosure may be implemented.

FIG. 1 illustrates a block diagram of a design of a prior art wireless communication device 100 in which the techniques of the present disclosure may be implemented. FIG. 1 shows an example transceiver design. In general, the conditioning of the signals in a transmitter and a receiver may be performed by one or more stages of amplifier, filter, upconverter, downconverter, etc. These circuit blocks may be arranged differently from the configuration shown in FIG. 1. Furthermore, other circuit blocks not shown in FIG. 1 may also be used to condition the signals in the transmitter and receiver. Unless otherwise noted, any signal in FIG. 1, or any other figure in the drawings, may be either single-ended or differential. Some circuit blocks in FIG. 1 may also be omitted.

In the design shown in FIG. 1, wireless device 100 includes a transceiver 120 and a data processor 110. The data processor 110 may include a memory (not shown) to store data and program codes. Transceiver 120 includes a transmitter 130 and a receiver 150 that support bi-directional communication. In general, wireless device 100 may include any number of transmitters and/or receivers for any number of communication systems and frequency bands. All or a portion of transceiver 120 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the design shown in FIG. 1, transmitter 130 and receiver 150 are implemented with the direct-conversion architecture.

In the transmit path, data processor 110 processes data to be transmitted and provides I and Q analog output signals to transmitter 130. In the exemplary embodiment shown, the data processor 110 includes digital-to-analog-converters (DAC's) 114a and 114b for converting digital signals generated by the data processor 110 into the I and Q analog output signals, e.g., I and Q output currents, for further processing.

Within transmitter 130, lowpass filters 132a and 132b filter the I and Q analog output signals, respectively, to remove undesired images caused by the prior digital-to-analog conversion. Amplifiers (Amp) 134a and 134b amplify the signals from lowpass filters 132a and 132b, respectively, and provide I and Q baseband signals. An upconverter 140 upconverts the I and Q baseband signals with I and Q transmit (TX) local oscillator (LO) signals from a TX LO signal generator 190 and provides an upconverted signal. A filter 142 filters the upconverted signal to remove undesired images caused by the frequency upconversion as well as noise in a receive frequency band. A power amplifier (PA) 144 amplifies the signal from filter 142 to obtain the desired output power level and provides a transmit RF signal. The transmit RF signal is routed through a duplexer or switch 146 and transmitted via an antenna 148.

In the receive path, antenna 148 receives signals transmitted by base stations and provides a received RF signal, which is routed through duplexer or switch 146 and provided to a low noise amplifier (LNA) 152. The duplexer 146 is designed to operate with a specific RX-to-TX duplexer frequency separation, such that RX signals are isolated from TX signals. The received RF signal is amplified by LNA 152 and filtered by a filter 154 to obtain a desired RF input signal. Downconversion mixers 161a and 161b mix the output of filter 154 with I and Q receive (RX) LO signals (i.e., LO_I and LO_Q) from an RX LO signal generator 180 to generate I and Q baseband signals. The I and Q baseband signals are amplified by amplifiers 162a and 162b and further filtered by lowpass filters 164a and 164b to obtain I and Q analog input signals, which are provided to data processor 110. In the exemplary embodiment shown, the data processor 110 includes analog-to-digital-converters (ADC's) 116a and 116b for converting the analog input signals into digital signals to be further processed by the data processor 110.

In FIG. 1, TX LO signal generator 190 generates the I and Q TX LO signals used for frequency upconversion, while RX LO signal generator 180 generates the I and Q RX LO signals used for frequency downconversion. Each LO signal is a periodic signal with a particular fundamental frequency. A PLL 192 receives timing information from data processor 110 and generates a control signal used to adjust the frequency and/or phase of the TX LO signals from LO signal generator 190. Similarly, a PLL 182 receives timing information from data processor 110 and generates a control signal used to adjust the frequency and/or phase of the RX LO signals from LO signal generator 180. In an implementation, the PLL's 182, 192 may also receive a reference frequency signal from one or more crystal oscillators provided with the device 100.

In certain implementations (not shown in FIG. 1), a balun may be provided between the output of the LNA 152 and the mixers 161a, 161b of the receiver 150. The balun may convert a single-ended signal to a differential signal, and may include, e.g., a transformer that mutually couples a signal from a primary winding to a secondary winding.

Figure 2:
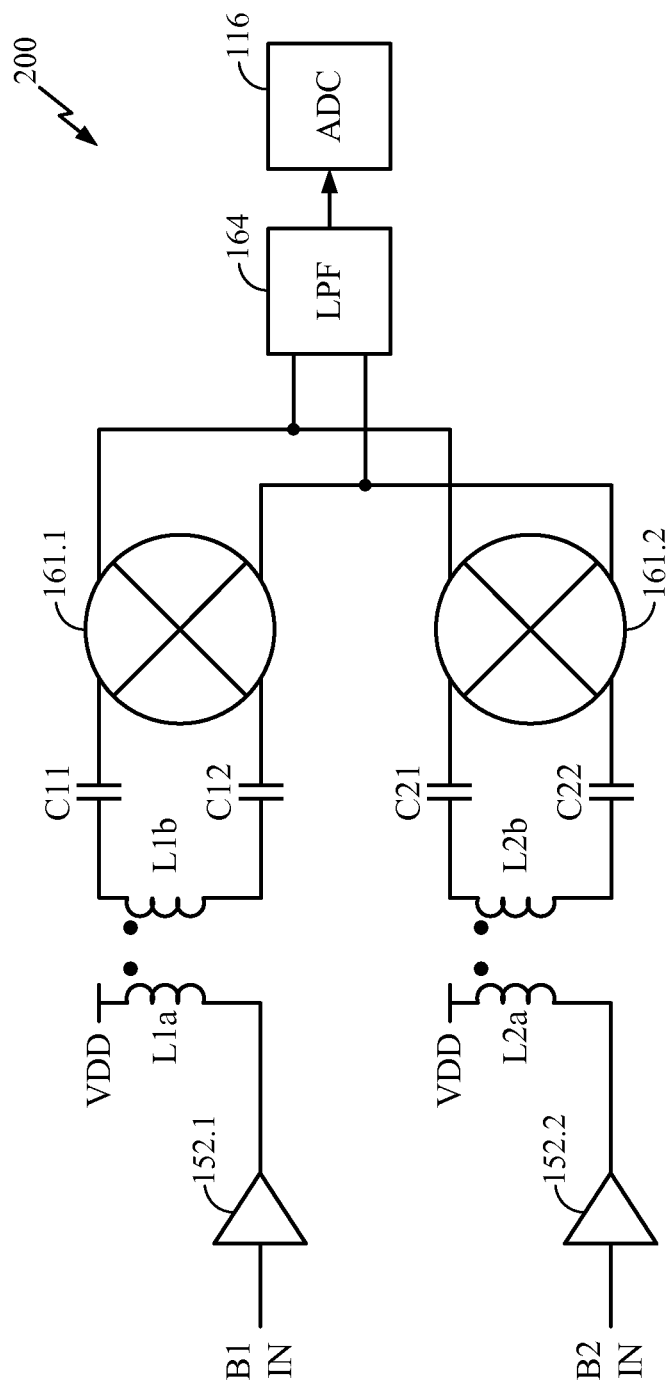
FIG. 2 illustrates an implementation of a receiver for processing receive signals in two separate frequency bands, utilizing two separate transformers.

FIG. 2 illustrates an implementation of a receiver 200 for processing receive signals in two separate frequency bands, utilizing two separate transformers.

In FIG. 2, a first LNA 152.1 receives a first band input signal B1 IN, and amplifies B1 IN to generate an output signal coupled to a first band winding L1a. The first primary winding or inductor L1a is mutually coupled to a secondary winding or inductor L1b according to a transformer configuration, and the differential signal across the secondary winding L1b is coupled to the inputs of a first band mixer 161.1 via coupling capacitors C11, C12. Note in this manner, the single-ended output of LNA 152.1 is converted to a differential input for mixer 161.1. The first band mixer 161.1 may be implemented in various manners, e.g., one or more downconversion mixers may convert the mixer input down in frequency by multiplying with one or more (e.g., in-phase and quadrature) local oscillator (LO) signal(s) (not shown in FIG. 2) to generate a first differential mixer output signal.

Note in certain alternative implementations (not shown), the coupling capacitors C11, C12 may be omitted when passive mixers are used. For example, the winding L1b may be directly (e.g., DC) coupled to the mixer 161.1.

In FIG. 2, a second band input signal B2 IN is similarly provided to a second LNA 152.2, and a second signal path including mutually coupled windings L2a, L2b, coupling capacitors C21, C22, and second mixer 161.2 generates a second differential mixer output signal. The first and second differential mixer output signals are coupled together and input to a low-pass filter 164, and the filtered output subsequently provided to ADC 116 for digitization. As noted above for the first signal path, in alternative implementations (not shown), the coupling capacitors C21, C22 may be omitted when passive mixers are used. For example, the winding L2b may be directly (e.g., DC) coupled to the mixer.

In an exemplary embodiment, B1 may correspond, e.g., to a high frequency band, while B2 may correspond to a relatively lower frequency band. In alternative exemplary embodiments, other correspondences between bands and frequencies may be adopted within the scope of the present disclosure.

In this specification and in the claims, the term "mutual coupling" may be understood to denote coupling of magnetic flux between two windings of a transformer, in contrast to other types of coupling such as direct electrical coupling (e.g., coupling via a conductive path of low resistance), or mechanical coupling, etc. Furthermore, it will generally be understood that the denotation herein of a winding of a transformer as "primary" and another winding of the transformer as "secondary" is arbitrary, and any alternative convention may readily be adopted for discussion purposes without altering the scope of the present disclosure.

It will be appreciated that the receiver architecture 200 necessitates providing a separate signal path for each receive signal band. In particular, a first mixer 161.1 (with associated elements) is required to process B1 IN, and a second mixer 161.2 (with associated elements) is required to process B2 IN, etc. Furthermore, each path requires a separate single-ended-to-differential conversion mechanism, such as transformer L1a/L1b or L2a/L2b. These requirements thus impose heavy area and current consumption penalties on circuitry utilizing such architectures.

Figure 3:
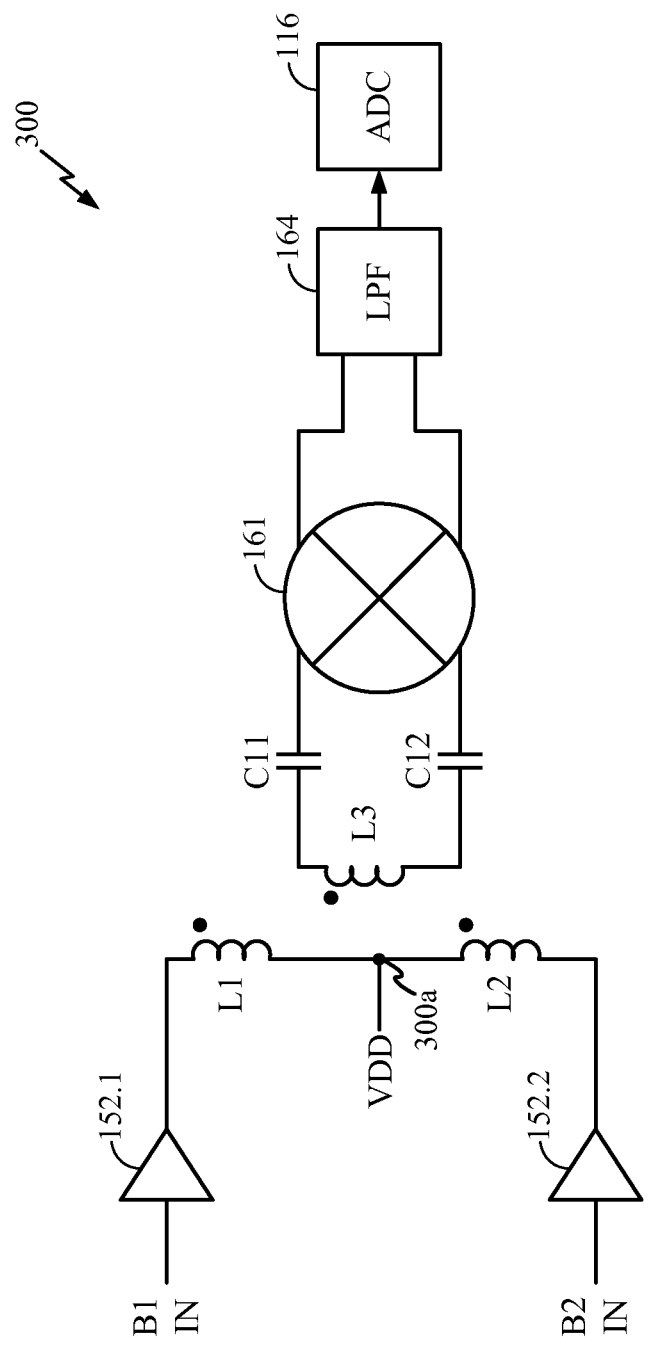
FIG. 3 illustrates an alternative implementation of a receiver incorporating a multi-port transformer.

FIG. 3 illustrates an alternative implementation 300 of a receiver incorporating a multi-port transformer. In FIG. 3, the output of the first LNA 152.1 is coupled to a first primary winding L1, and the output of the second LNA 152.2 is coupled to a second primary winding L2. L1 and L2 are magnetically coupled, as well as electrically coupled to each other in series, and may be implemented as, e.g., a single primary winding of a transformer that also includes a mutually coupled secondary winding L3. In particular, L1 and L2 may be implemented as a single winding, wherein an AC ground node 300a of the winding is tapped and coupled to the supply voltage VDD. In the case wherein L1 and L2 are implemented as a single winding, L1 and L2 may also be referred to herein as first and second portions, respectively, of a primary winding.

VDD may correspond to a fixed DC voltage supplying power to the circuit elements coupled thereto, and may further correspond to an AC ground voltage. In this specification and in the claims, the term "AC ground voltage" may correspond to any voltage that is effectively a ground voltage at AC, e.g., a DC supply voltage, a DC ground voltage, a bias voltage, etc. Such exemplary embodiments are contemplated to be within the scope of the present disclosure.

During normal operation of the receiver, it is expected that the receiver 300 is at most receiving on only one of the two bands B1 and B2, and thus only one of LNA's 152.1 and 152.2 will be active at any time. In this manner, while L3 is magnetically coupled to both L1 and L2, by design, L3 will receive only the active signal from either L1 or L2. It will be appreciated that, as L1 and L2 are implemented as a single primary winding, the receiver 300 advantageously utilizes less components than, e.g., the receiver 200 shown in FIG. 2. Furthermore, the receiver 300 allows sharing of a single mixer 161 between two bands B1 and B2 (or possibly amongst three or more bands, in alternative implementations not shown). Thus, the mixer 161 may also be denoted herein as "shared circuitry." Note the mixer 161 may incorporate, e.g., both an I mixer and a Q mixer, which are not separately shown in FIG. 3. Also, certain implementations may eliminate capacitors C11, C12, and directly (DC) couple winding L3 to the shared mixer 161.

It will be appreciated that in certain scenarios, e.g., if the capacitive loading of the inactive signal path is not insignificant, or if the turns ratio of the inactive path primary winding to the secondary winding is not very large, then the active LNA signal path may undesirably experience loading effects from the inactive signal path. For example, when LNA 152.1 is active and LNA 152.2 is inactive, e.g., when the receiver 300 is configured to receive signals on B1, then L3 still experiences loading from L2 through the transformer coupling between L2 and L3, even though L2 is not actively in use. This effect reduces the signal current flowing into the mixer 161, thereby degrading the noise figure (NF) of the B1 signal path, and also reducing the overall signal gain of the B1 signal. The same effect will also degrade the performance of the B2 signal path when LNA 152.2 is active and LNA 152.1 is inactive.

It is thus desirable to provide techniques for improving the performance of multi-band communications devices that utilize transformer sharing across multiple bands.

Figure 3A:
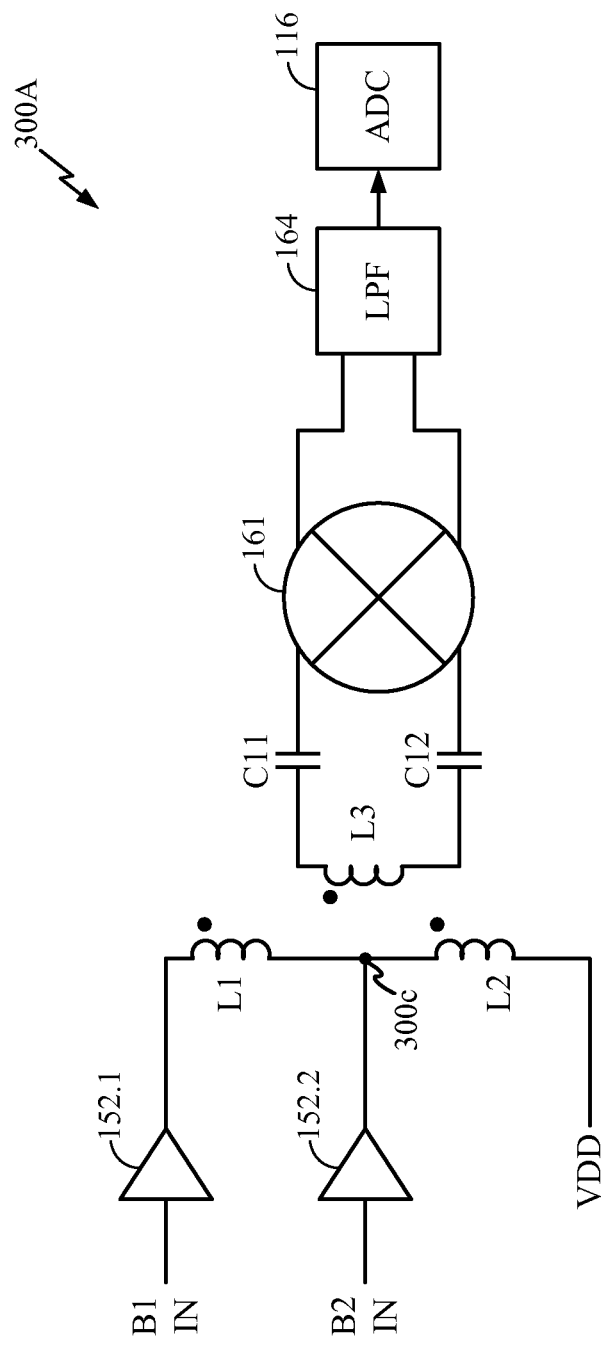
FIG. 3A illustrates an alternative exemplary embodiment of a receiver incorporating a multi-port transformer.

FIG. 3A illustrates an alternative implementation 300A of a receiver incorporating a multi-port transformer. In FIG. 3A, the output of the B2 LNA 152.2 is coupled to an auxiliary intermediate node 300c of the primary winding, which includes first primary winding L1 and second primary winding L2. According to this implementation, the B2 LNA 152.2 effectively encounters the second primary winding L2 at its output, while the B1 LNA 152.1 encounters a larger impedance corresponding to the combination of the first primary winding L1 and the second primary winding L2. It will be noted that the embodiment 300A nevertheless will support current flowing in L2 during B1 operation. Note the primary winding may be smaller compared to the primary winding of, e.g., implementation 300 of FIG. 3.

In the implementation shown, when LNA 152.1 is active, LNA 152.2 is inactive. However, the off-state parasitic capacitance of LNA 152.2 coupled to node 300c will reduce current flowing the L2 winding, thereby reducing the signal path gain for LNA 152.1 and degrading the noise figure (NF) of the B1 signal path. Similarly, when LNA 152.2 is active and LNA 152.1 is inactive, the non-negligible capacitive loading of LNA 152.1 will reduce the current flowing into the L2 coil, resulting in reduced signal path gain for LNA 152.2 and degraded noise figure of the B2 signal path.

Figure 4:
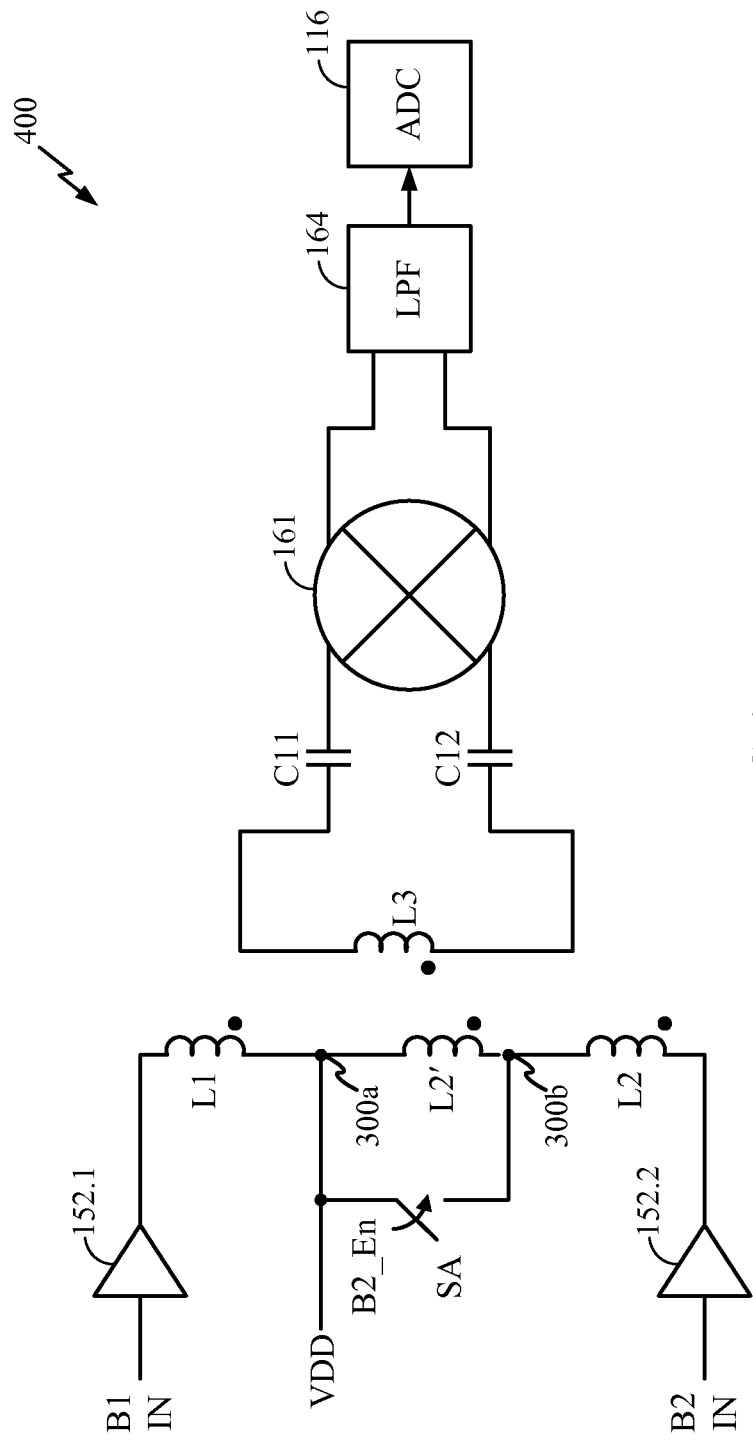
FIG. 4 illustrates an exemplary embodiment of a receiver according to the present disclosure.

FIG. 4 illustrates an exemplary embodiment 400 of a receiver according to the present disclosure. Note FIG. 4 is shown for illustrative purposes only, and is not meant to limit the scope of the present disclosure.

In FIG. 4, the output of the first LNA 152.1 is coupled to VDD via a first primary winding L1. The output of the second LNA 152.2 is coupled to VDD via a second primary winding that is implemented as a series combination of L2 and L2'. In this specification and in the claims, L2' may also be denoted as the "auxiliary second primary winding." L2' may further be denoted an "auxiliary second portion" of the primary winding if, e.g., L1, L2, and L2' are implemented as a single winding. A switch SA is further provided to directly couple VDD to the node between L2 and L2', also denoted herein as the "intermediate node" 300b. In an exemplary embodiment, switch SA is closed when B2_En is low, i.e., when the B1 signal path is active. In this manner, the winding L2' is bypassed when the active signal path couples L1 to L3/L3' to process B1 signals, thus reducing any gain attenuation in the active signal path due to coupling between L2' and L3 (since L2' would be shorted out by SA). While gain attenuation may thereby be alleviated, it will nevertheless be appreciated that residual mutual coupling may still be present, e.g., between L2 and L3.

In an exemplary embodiment, the primary windings L1, L2', and L2 may be implemented as a single winding forming a primary winding of a transformer which further includes a secondary winding formed by L3. In this case, the coupling to VDD and to the switch SA may be provided by tapping a "supply" node 300a of the single winding. This will achieve a similar effect when the receiver 400 is configured to receive B2 signals. Such alternative exemplary embodiments are contemplated to be within the scope of the present disclosure.

While gain attenuation in the active signal path may be alleviated according to the scheme described hereinabove with reference to FIG. 4, it will nevertheless be appreciated that residual mutual coupling may still be present, e.g., between L2 and L3 during B1 operation, and between L1 and L3 during B2 operation. This mutual coupling causes a portion of the signal current to flow in the L2 winding, thereby reducing the gain of LNA 152.1 when the B1 signal path is active, and further degrading the noise figure (NF) of the B1 signal path.

Figure 5:
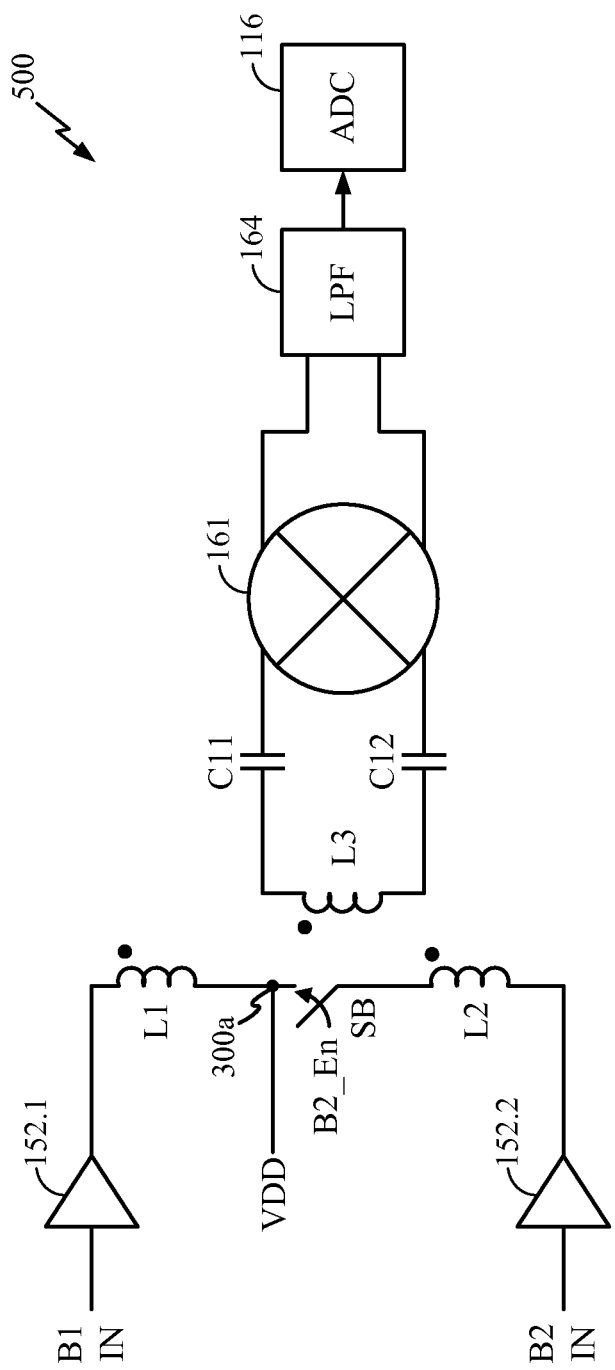
FIG. 5 illustrates an alternative exemplary embodiment of a receiver according to the present disclosure.

FIG. 5 illustrates an alternative exemplary embodiment 500 of a receiver according to the present disclosure. Note FIG. 5 is shown for illustrative purposes only, and is not meant to limit the scope of the present disclosure.

In FIG. 5, the output of the first LNA 152.1 is coupled to VDD via a first primary winding L1. The output of the second LNA 152.2 is coupled to the AC ground node 300a via a second primary winding L2 and a series-coupled switch SB. By opening or closing the switch SB, L2 may be selectively decoupled from or coupled to VDD, respectively. In an exemplary embodiment, SB is open when B2_En is low, i.e., when the B1 signal path is active. In this manner, L2 is decoupled from VDD when the active signal path couples L1 to L3 to process B1 signals. Thus in the exemplary embodiment shown, L2 does not cause degradation of the signal across L3 through mutual coupling when the LNA 152.1 is active, e.g., when the receiver 500 is configured to receive B1 signals. This is due to the fact that there is no current flowing in L2 when SB is open. In this manner, the noise figure and gain of the receiver 500 are improved versus that of, e.g., the receiver 400.

Note when the B2 signal path is active, B2_En is high, and thus SB is closed. In this manner, L2 is coupled to VDD when LNA 152.2 generates an output signal to be coupled from L2 to L3. Note the B2 signal path operation will also be affected by loading from L1. However, if B2 is designed for a lower frequency of operation, then typically L2 would be much larger than L1. Hence, despite no decoupling from L1 during B2 signal path operation, degradation in B2 performance may nevertheless be negligible.

In an aspect of the present disclosure, it will be appreciated that, during B2 operation, switch SB will be in series with VDD, and as VDD will typically not be subject to large voltage variations, there will be minimal voltage swing across the terminals of SB. Therefore, it is expected that minimal nonlinearity will be introduced by charging and discharging of any parasitic capacitances associated with SB. Furthermore, any parasitic capacitance associated with SB would not unduly load the B2 signal path and LNA 152.2 during B2 operation, since SB is placed near the VDD port, rather than adjacent to the LNA output. In another aspect, the switch SB provides isolation to prevent undesirable spurious signal and/or noise coupling, e.g., from the inactive signal path to the active signal path.

In an exemplary embodiment, the size of switch SB may further be optimized to reduce the noise figure of the receiver 500. It will be appreciated that a large size for switch SB adds parasitic capacitance and reduces the isolation between L2 and L3. On the other hand, a small switch size for switch SB adds more signal loss when SB is closed and the B2 signal path is active. It will be appreciated that, in general, the switch SB should be placed in series with the primary winding whose number of turns relative to the secondary winding is larger. For example, if the winding ratio L2/L3 is much larger than the winding ratio L1/L3, then the switch should be placed in series with the L2 winding. On the other hand, if L1/L3 is much larger than L2/L3, then the switch should be placed in series with the L1 winding.

It will be appreciated that, in general, increasing the size of SB will reduce its ON series resistance, and hence will improve the noise performance of B2 path. However, an excessively large size for SB will introduce capacitive loading to the B1 signal path through magnetic coupling from L2-L3 windings and degrade the performance of the B1 signal path. Hence, SB size should be optimized in order to obtain acceptable performance for both B1 and B2.

Figure 6:
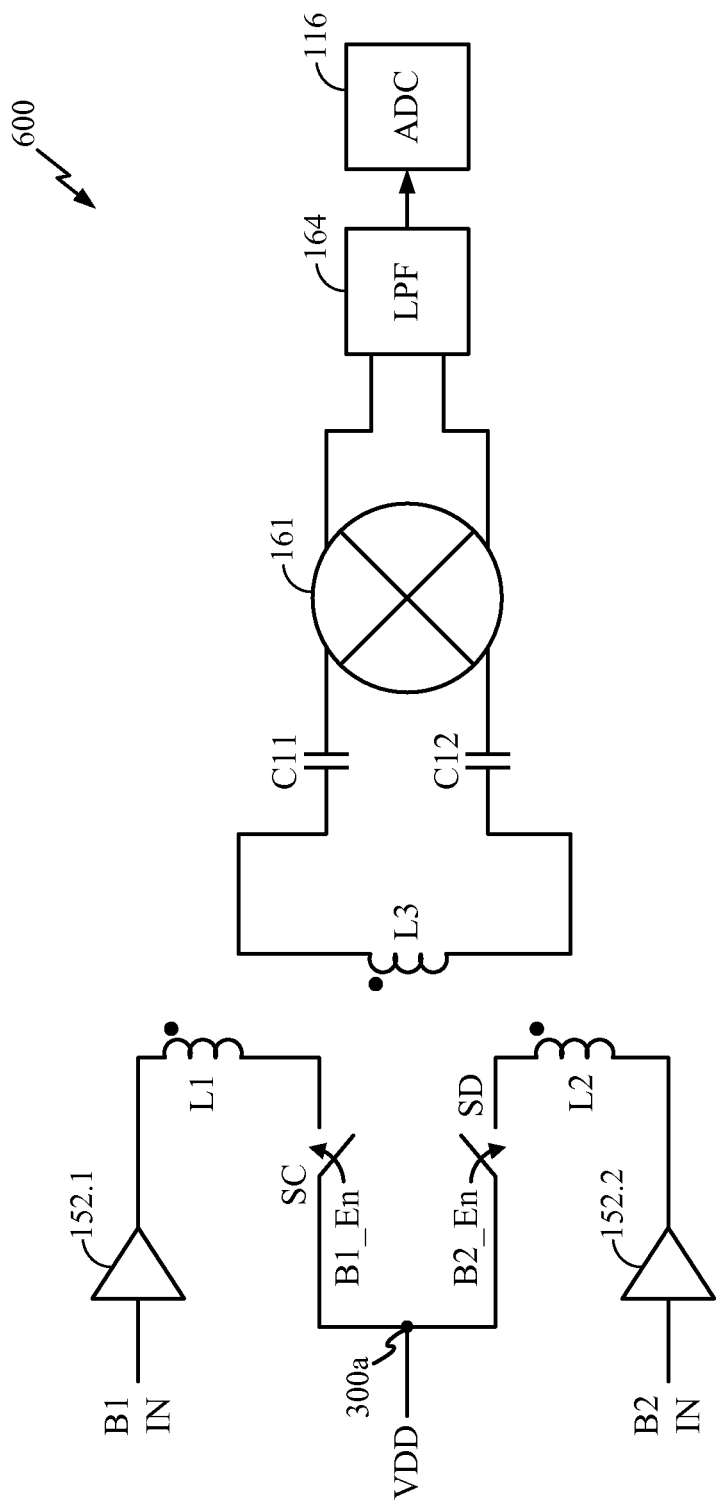
FIG. 6 illustrates an alternative exemplary embodiment according to the present disclosure.

FIG. 6 illustrates an alternative exemplary embodiment 600 according to the present disclosure. In FIG. 6, the output of the first LNA 152.1 is coupled via L1 and a series-coupled switch SC to VDD, while the output of the second LNA 152.2 is coupled via L2 and a series-coupled switch SD to VDD. In an exemplary embodiment, SC is controlled by a signal B1_En, which is set high during B1 operation, while SD is controlled by a signal B2_En, which is set high during B2 operation. In an exemplary embodiment, during B1 operation, SC may be closed, and SD may be open, while during B2 operation, SD may be closed, and SC may be open. In this manner, the advantages of the receiver 500 described with reference to FIG. 5 may be applied to processing for both bands B1 and B2 in the receiver 600. Note while the exemplary embodiment 600 is shown accommodating two receive bands, the techniques described hereinabove may readily be applied to accommodate more than two bands, and such alternative exemplary embodiments are contemplated to be within the scope of the present disclosure.

Figure 7:
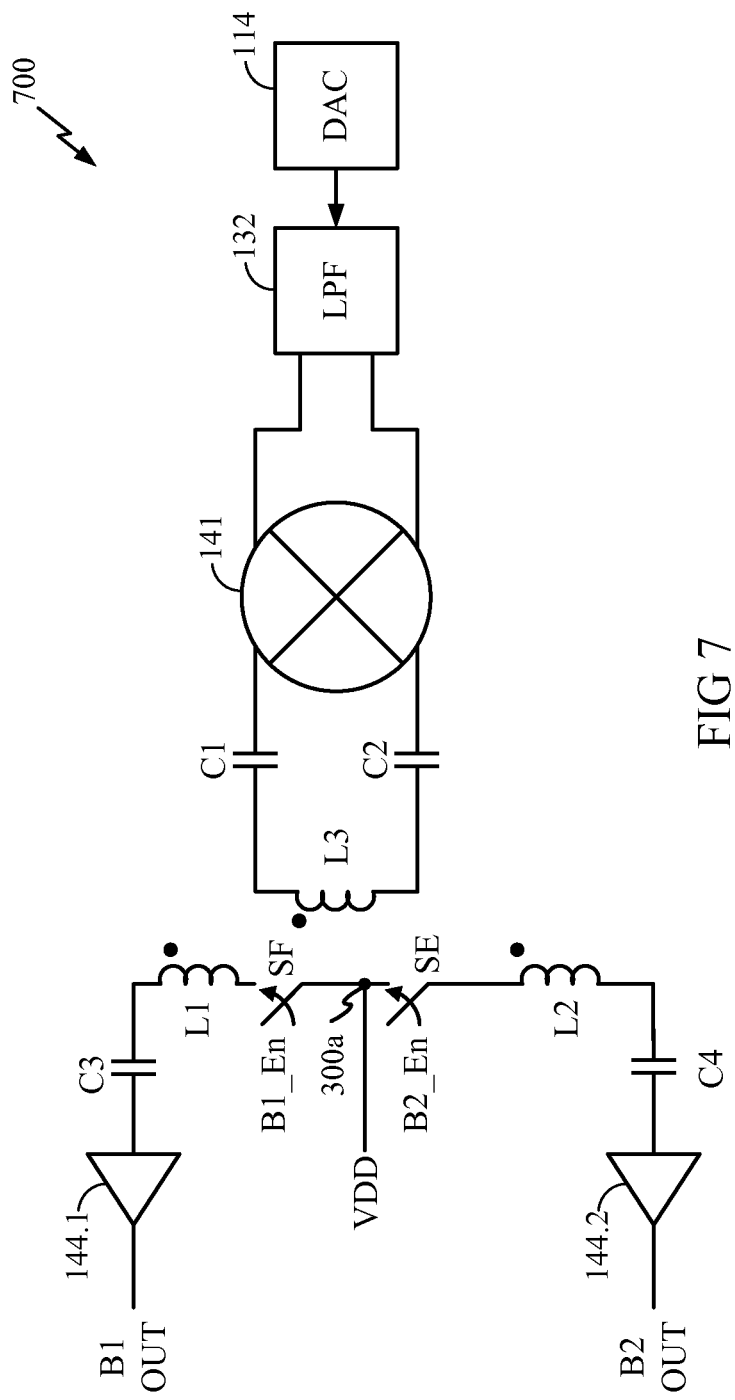
FIG. 7 illustrates an alternative exemplary embodiment of the present disclosure, in which techniques disclosed herein are applied to a transmitter.

FIG. 7 illustrates an alternative exemplary embodiment 700 of the present disclosure, in which the techniques disclosed herein are applied to a transmitter. In FIG. 7, the output of a digital-to-analog converter 114 is coupled to a low-pass filter (LPF) 132. The differential output of LPF 132 is coupled to the differential input of an upconversion mixer 141, whose output in turn may be coupled via coupling capacitors C1, C2 to the differential ends of a winding L3. In an exemplary embodiment, L3 forms a primary winding of a transformer that also includes a secondary winding formed by L1 and L2. The other terminals of L1 and L2 are coupled to driver amplifiers 144.1 and 144.2 via coupling capacitors C3, C4, respectively.

In FIG. 7, L1 is coupled to VDD by a series-coupled switch SF, and L2 is coupled to VDD by a series-coupled switch SE. Note depending upon the design, VDD can also be replaced by GND. Note in this specification and in the claims, any node denoted by GND may generally correspond to any AC ground voltage having any DC level, unless otherwise noted. Such alternative exemplary embodiments are contemplated to be within the scope of the present disclosure.

In an exemplary embodiment, SE may be controlled by a control signal B2_En, which may be high during B2 operation and switch SE may be closed, i.e., for transmission in the frequency band B2. Similar to the case described for the receiver 500, SE may decouple L2 from VDD during B1 operation, and may couple L2 to VDD during B2 operation. In this manner, loading of the primary winding by the secondary winding associated with the inactive signal path may be reduced. Note a switch SF may similarly be provided to couple L1 to VDD during B1 operation, and furthermore, a separate winding (not shown) may be provided for each of possibly more than two signal paths (not shown) sharing a common upconversion mixer 141. Such alternative exemplary embodiments are contemplated to be within the scope of the present disclosure.

Figure 8:
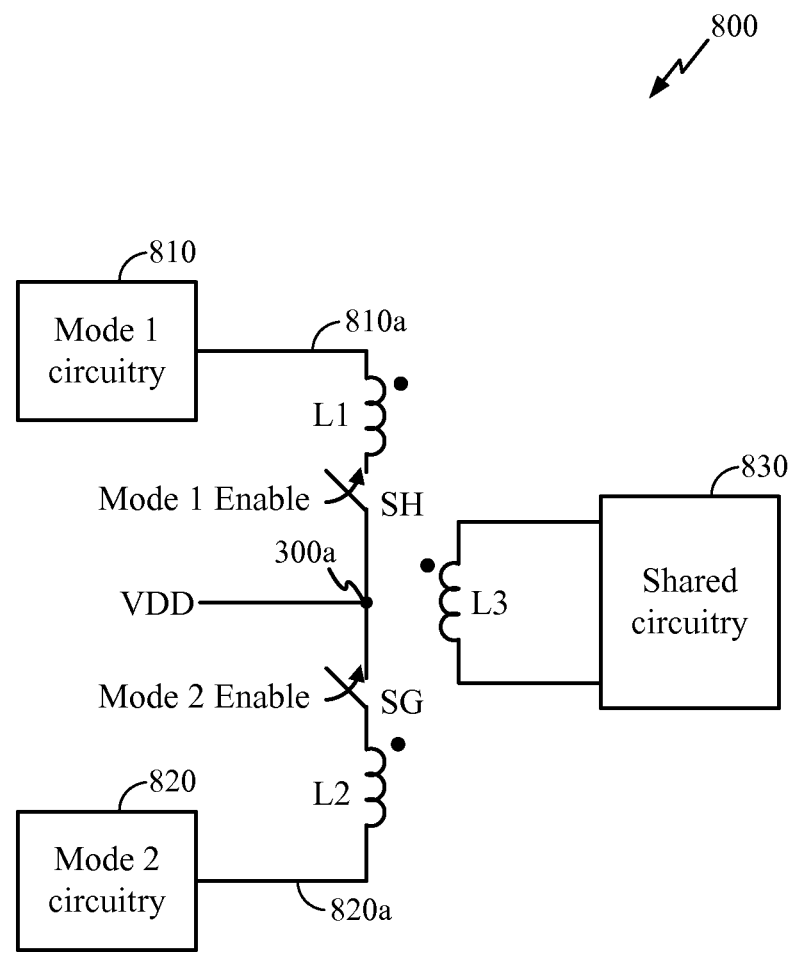
FIG. 8 illustrates an alternative exemplary embodiment of the present disclosure, wherein generic techniques are shown for accommodating multiple modes using single shared circuitry.

FIG. 8 illustrates an alternative exemplary embodiment 800 of the present disclosure, wherein generic techniques are shown for accommodating multiple modes using single shared circuitry. In this specification and in the claims, the term "mode" may encompass any type of operation having a distinct set of characteristics. For example, a mode may encompass a "frequency band" as used elsewhere in this specification, and thus Mode 1 and Mode 2 may refer to Band 1 and Band 2. Alternatively, a mode may encompass, e.g., a "channel" such as a time-multiplexed, code-multiplexed, or spatially multiplexed channel, etc. Such alternative exemplary embodiments are contemplated to be within the scope of the present disclosure.

In FIG. 8, a node 810a of Mode 1 circuitry 810, or "first mode circuitry," is coupled to VDD via winding L1 and a switch SH. A node 820a of Mode 2 circuitry 820, or "second mode circuitry," is coupled to VDD via second primary winding L2 and a switch SG. In general, nodes 810a and 820a may correspond to input and/or output signal nodes of Mode 1 circuitry 810 and Mode 2 circuitry 820, respectively. The magnetic flux of L1 and L2 are coupled to that of L3 in a transformer configuration, and L3 is correspondingly coupled to shared circuitry 830. The shared circuitry 830 may function to process signals associated with both Mode 1 and Mode 2

As similarly described for exemplary embodiments hereinabove, switch SG may be closed and switch SH may be open when Mode 2 Enable is high, e.g., when Mode 2 circuitry 820 is actively processing signals associated with Mode 2. Conversely, switch SG may be open and switch SH may be closed when Mode 2 enable is low, e.g., when Mode 1 circuitry 810 is actively processing signals associated with Mode 1. In light of the present disclosure, it will be appreciated that decoupling L2 from VDD when Mode 2 is inactive advantageously decreases the loading of L3 by L2.

Figure 9:
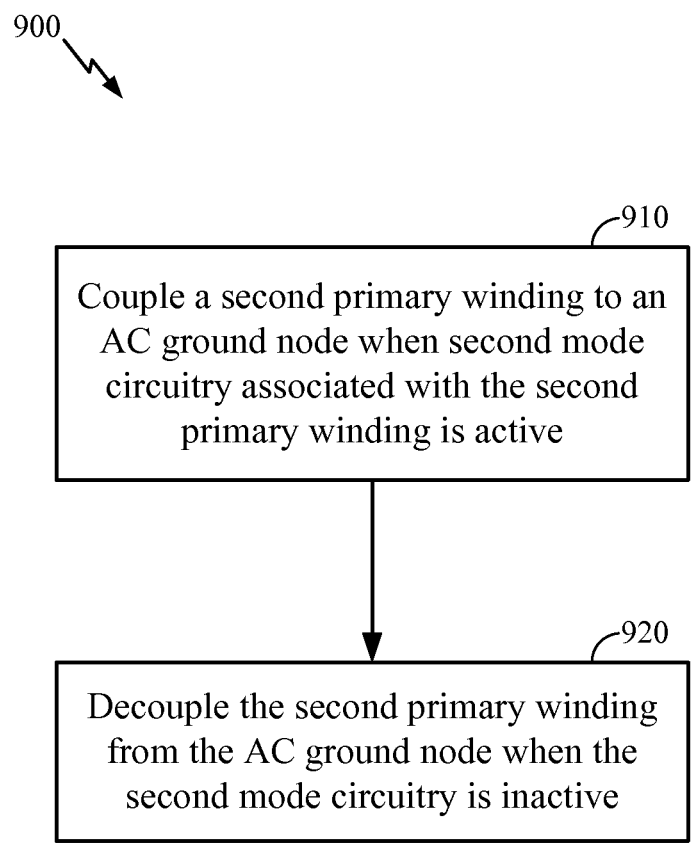
FIG. 9 illustrates an exemplary embodiment of a method according to the present disclosure.

FIG. 9 illustrates an exemplary embodiment of a method according to the present disclosure. Note FIG. 9 is shown for illustrative purpose only, and is not meant to limit the scope of the present disclosure to any particular method shown.

In FIG. 9, at block 910, a second primary winding is coupled to an AC ground node when second mode circuitry associated with the second primary winding is active. The AC ground node is coupled to an AC ground voltage, a first primary winding is further coupled to the AC ground node, and the first and second primary windings are mutually coupled to a secondary winding.

At block 920, the second primary winding is decoupled from the AC ground node when the second mode circuitry is inactive.

While particular implementations are shown for processing two bands, it will be understood that more than two bands may also be accommodated using the receiver architectures shown. Furthermore, it will be appreciated that, for ease of illustration, certain transceiver elements are not shown in all figures, e.g., baseband amplifiers, filters, etc., although such elements may also be incorporated in the transceivers shown.

FIGS. 10-14 illustrate alternative exemplary embodiments of the present disclosure, wherein techniques described herein are applied to further single-ended-to-differential signal conversion scenarios in receivers. Note the exemplary embodiments in FIGS. 10-14 are shown for illustrative purposes only, and are not meant to limit the scope of the present disclosure. Furthermore, it will be appreciated that the LNA 152 shown in FIGS. 10-14 is not limited to any particular architecture or circuit topology. For example, the LNA 152 may be single stage, multi-stage, common-source, or common-gate, or any other type of circuit topology known in the art, and such exemplary embodiments are contemplated to be within the scope of the present disclosure.

Figure 10:
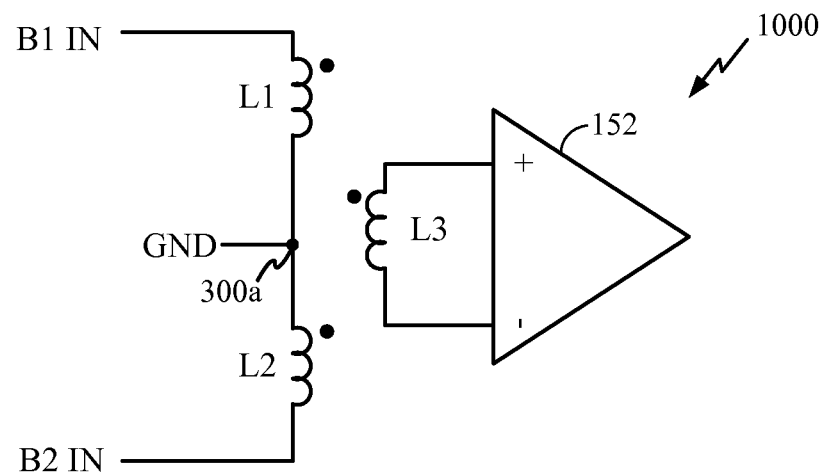
FIGS. 10-14 illustrate alternative exemplary embodiments of the present disclosure, wherein techniques described herein are applied to further single-ended-to-differential signal conversion scenarios in receivers.

In the exemplary embodiment 1000 of FIG. 10, a single-ended signal B1 IN corresponding to a first band is coupled to the first primary winding L1, while a single-ended signal B2 IN corresponding to a second band is coupled to the second primary winding L2. L1 and L2 are coupled to each other at an AC ground node 300a, labeled as GND in FIG. 10. L1 and L2 are further mutually coupled to the secondary winding L3, whose differential ends are coupled to the input of an amplifier 152, e.g., a low-noise amplifier (LNA) of a receiver front-end. In this manner, the single-ended signal B1 IN or B2 IN is converted to a differential signal for input to the amplifier 152.

In certain exemplary embodiments, B1 IN and B2 IN may be each coupled to, e.g., a pin on an integrated circuit configured to accept signals for receive processing in the respective band. For example, B1 IN may be coupled to the output of a SAW filter, a duplexer, an external matching network, or other type of filter tuned to the B1 band, while B2 IN may be coupled to the output of a SAW filter, a duplexer, an external matching network, or other type of filter tuned to the B2 band. In alternative exemplary embodiments, B1 IN and B2 IN may be coupled to other nodes, on-chip or off-chip, and such alternative exemplary embodiments are contemplated to be within the scope of the present disclosure.

Figure 11:
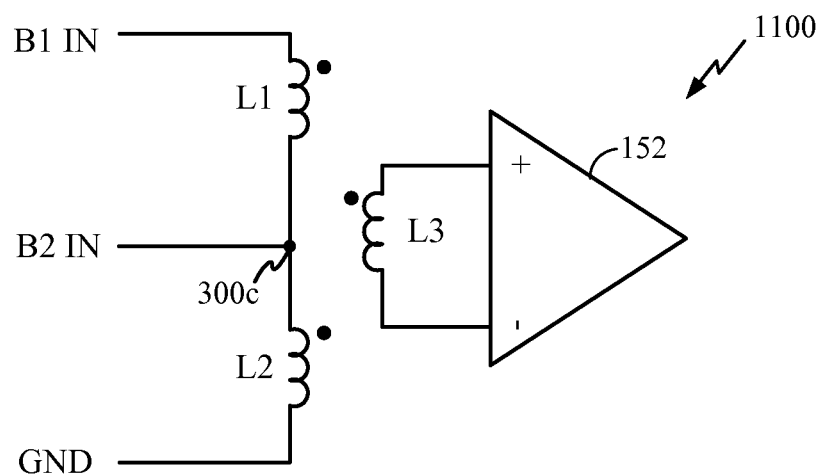

In the exemplary embodiment 1100 of FIG. 11, B1 IN is coupled to a first node of L1, and B2 IN is coupled to a second node of L1. The second node of L1 is coupled to L2, which is further coupled to GND. L1 and L2 are further mutually coupled to L3, whose differential terminals are coupled to amplifier 152. According to the principles described hereinabove, a single-ended signal present at either B1 IN or B2 IN may be converted to a differential signal input to amplifier 152 by the mutual coupling of L1 and L2 to L3. Furthermore, the L3 coil may be implemented with a center tap in the middle. Such a configuration may be useful for, e.g., biasing the LNA at an appropriate operating point.

Figure 12:
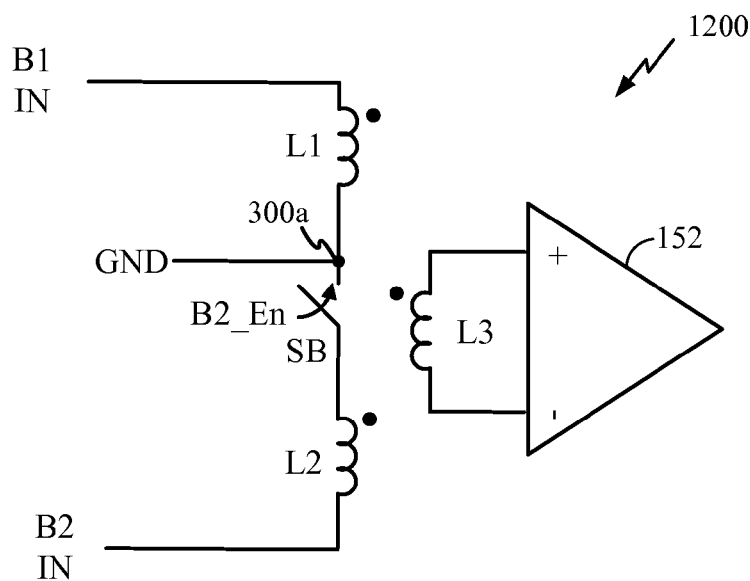

In the exemplary embodiment 1200 of FIG. 12, L2 is coupled to the AC ground node 300a by a switch SB. SB is controlled by a signal B2_En, such that SB is open when B2_En is low, and SB is closed when B2_En is high. In this manner, L2 is decoupled from GND when B1 is active, and L2 is coupled to GND when B2 is active. It will be appreciated that the exemplary embodiment 1200 has the aforementioned advantages of removing undesirable loading on L3 by L2 when B1 is active.

Figure 13:
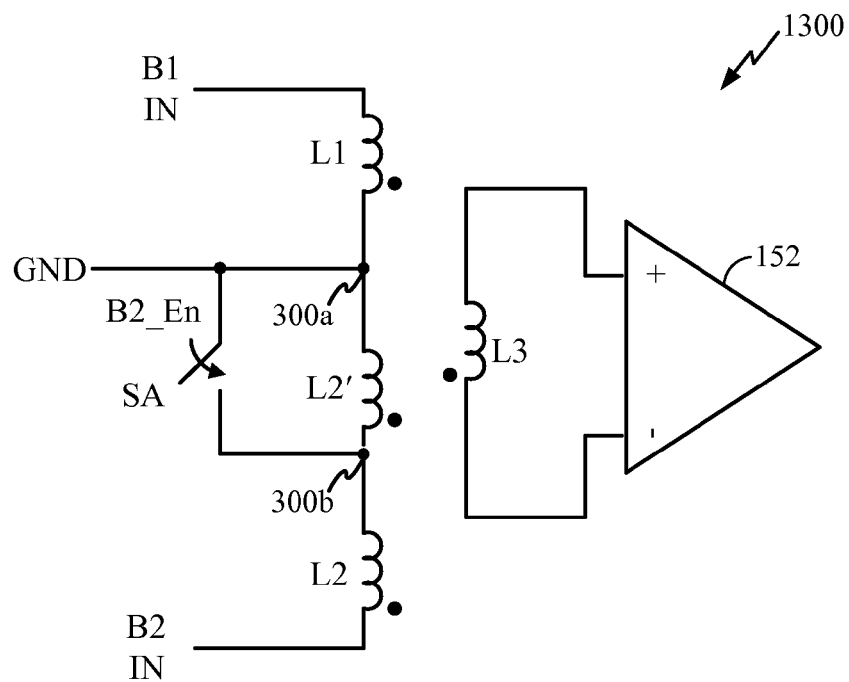

In the exemplary embodiment 1300 of FIG. 13, an auxiliary second primary winding L2' couples the AC ground node 300a to the second primary winding L2, and switch SA operates in the same manner as described hereinabove for SB.

Figure 14:
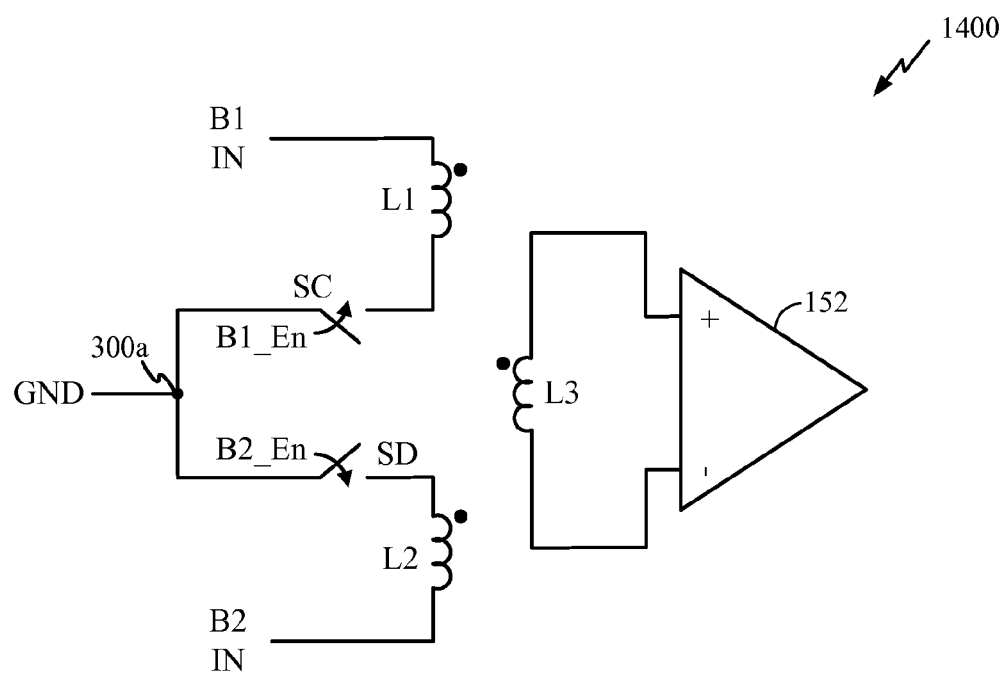

In the exemplary embodiment 1400 of FIG. 14, switches SC and SD are controlled by signals B1_En and B2_En, respectively. According to the principles described hereinabove, SC couples L1 to an AC ground node labeled as GND when B1_En is high, and SD couples L2 to an AC ground node labeled as GND when B2_En is high. In this manner, the advantageous features described with reference to FIG. 12 may be applied to operation in both B1 and B2.

Figure 15:
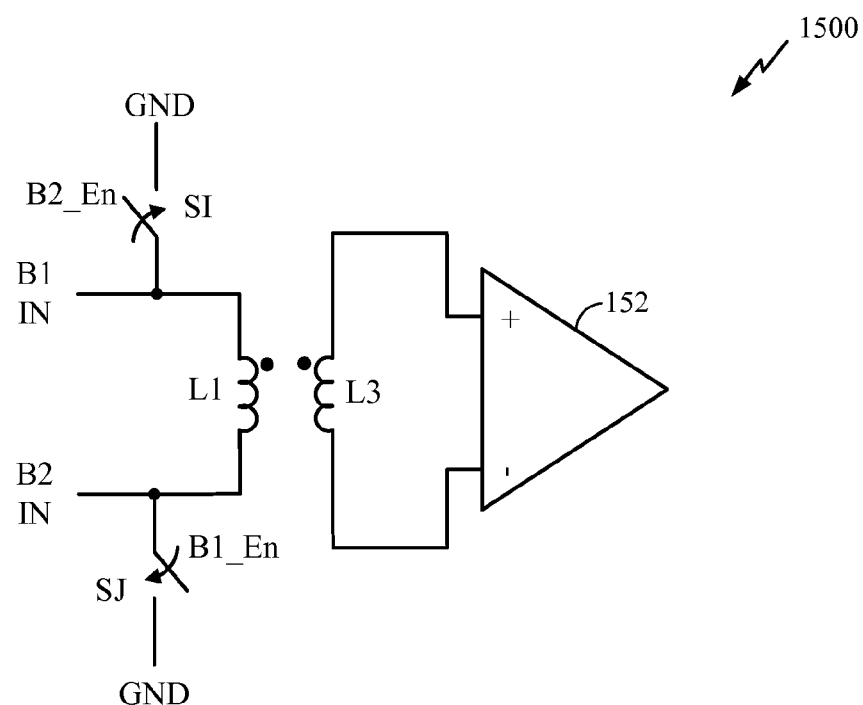
FIG. 15 illustrates an alternative exemplary embodiment of the present disclosure for single-ended-to-differential conversion in a receiver.

FIG. 15 illustrates an alternative exemplary embodiment 1500 of the present disclosure for single-ended-to-differential conversion in a receiver. In FIG. 15, single-ended signals B1 IN and B2 IN are coupled to first and second terminals, respectively, of a primary winding L1. The first terminal of L1 is further coupled to GND via a switch SI controlled by B2_En, while the second terminal of L1 is further coupled to GND via a switch SJ controlled by B1_En. During B1 operation, SI is open and SJ is closed, in which case L1 thus couples B1 IN to GND. During B2 operation, SI is closed and SJ is open, in which case L1 couples B2 IN to GND. As L1 is mutually coupled to L3, the exemplary embodiment 1500 advantageously performs single-ended-to-differential conversion for two bands B1 and B2 efficiently using a single primary winding L1 and two switches SI and SJ.

In an alternative exemplary embodiment (not shown), the transformer configuration L1-L3 and switch configuration SI, SJ may also be applied to convert single-ended LNA outputs associated with B1 and B2 to a differential input for a subsequent mixer, e.g., such as according to the application shown in FIG. 3. Such alternative exemplary embodiments are contemplated to be within the scope of the present disclosure.

Figure 16:
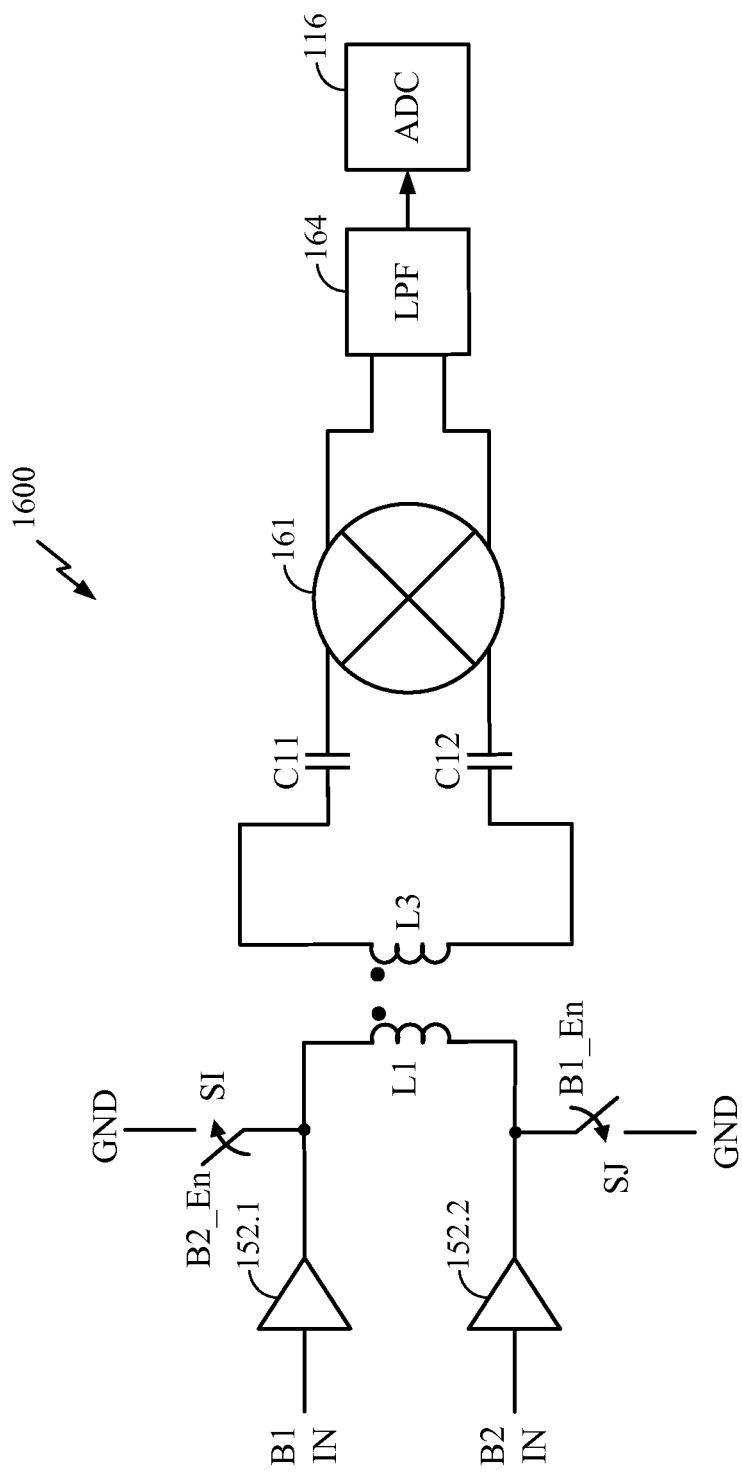
FIG. 16 illustrates an alternative exemplary embodiment of the present disclosure, wherein the transformer and switch configuration of FIG. 15 is utilized between the LNA's and down-conversion mixer of a receiver.

FIG. 16 illustrates an alternative exemplary embodiment of the present disclosure, wherein the transformer and switch configuration of FIG. 15 is utilized between the LNA's and down-conversion mixer of a receiver. In particular, in light of the description hereinabove with reference to FIG. 15, it will be appreciated that the switch SJ may be closed when B1_En is high, and the switch SI may be closed when B2_En is high. In this manner, the signal from either the output of the B1 LNA 152.1 or the B2 LNA 152.2 may be selectively coupled to the shared downconversion mixer 161 for further processing. As previously described hereinabove, the capacitors C11, C12 may be omitted in alternative exemplary embodiments utilizing a passive mixer.

Figure 17:
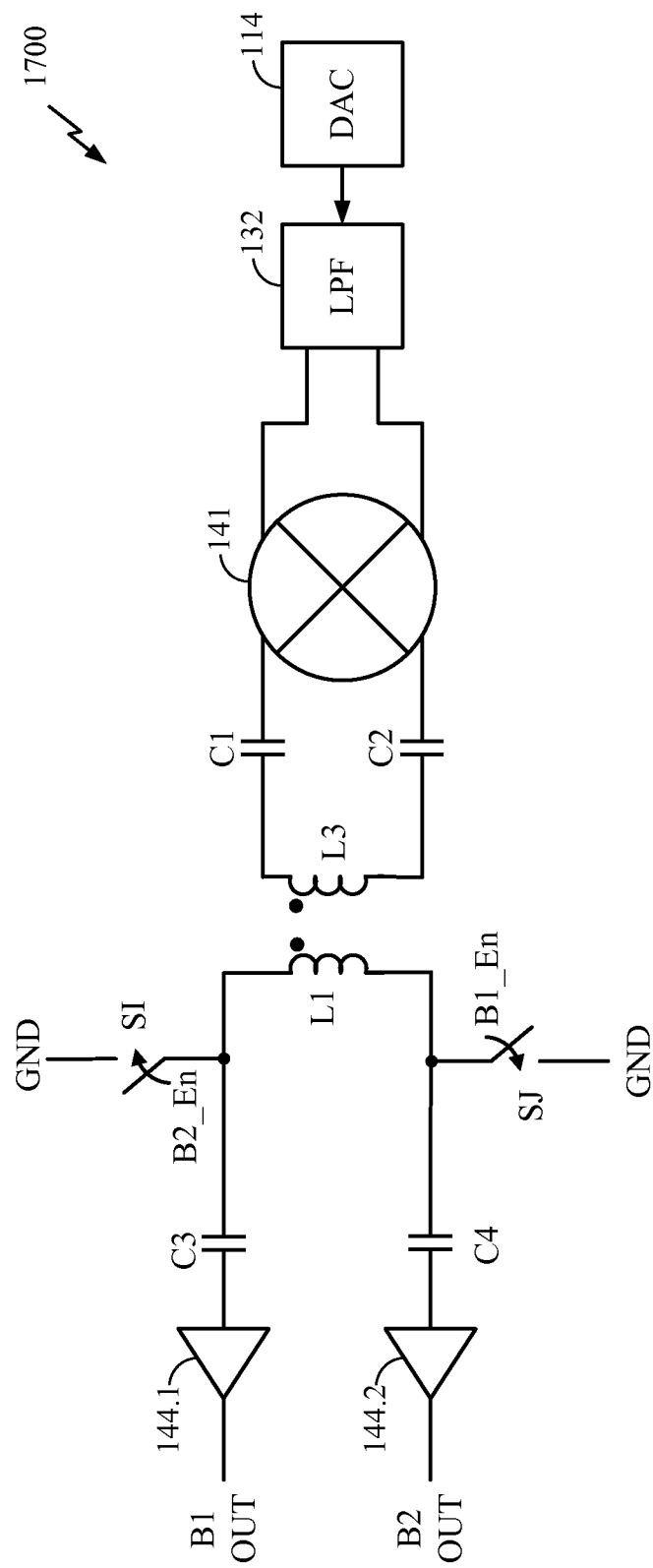
FIG. 17 illustrates an alternative exemplary embodiment of the present disclosure, in which techniques disclosed herein are applied to a transmitter.

FIG. 17 illustrates an alternative exemplary embodiment of the present disclosure, in which techniques disclosed herein are applied to a transmitter. In particular, in light of the description hereinabove with reference to FIG. 15, it will be appreciated that the switch SJ may be closed when B1_En is high, and the switch SI may be closed when B2_En is high. In this manner, the differential signal across L3 at the output of the upconversion mixer 141 may be selectively coupled to either the input of the driver amplifier 144.1 or the driver amplifier 144.2 via coupling capacitors C3, C4, respectively. As previously described hereinabove, the capacitors C1, C2 may be omitted in alternative exemplary embodiments utilizing a passive mixer.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Furthermore, when an element is referred to as being "electrically coupled" to another element, it denotes that a path of low resistance is present between such elements, while when an element is referred to as being simply "coupled" to another element, there may or may not be a path of low resistance between such elements.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects of the invention.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary aspects disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary aspects is provided to enable any person skilled in the art to make or use the invention. Various modifications to these exemplary aspects will be readily apparent to those skilled in the art, and the generic principles defined herein may be applied to other exemplary aspects without departing from the spirit or scope of the invention. Thus, the present disclosure is not intended to be limited to the exemplary aspects shown herein but is to be accorded the widest scope consistent with the principles and novel features disclosed herein.

The invention claimed is:

1. An apparatus comprising:
a primary winding comprising first and second portions connected to an AC ground node;
a secondary winding mutually coupled to the primary winding;
first mode circuitry coupled to the first portion and coupled to an input or an output for a radio frequency signal;
second mode circuitry coupled to the second portion and coupled to an input or an output for a radio frequency signal; and
a first switch coupled in series with the first portion and the AC ground node, wherein the first switch is configured to be closed when the first mode circuitry is active.

2. An apparatus comprising:
a primary winding comprising first and second portions connected to an AC ground node;
a secondary winding mutually coupled to the primary winding;
first mode circuitry coupled to the first portion;
second mode circuitry coupled to the second portion; and
a first switch coupled in series with the first portion and the AC ground node, wherein the first switch is configured to be closed when the first mode circuitry is active; and
circuitry coupled to the secondary winding configured to process signals associated with the first mode circuitry and the second mode circuitry.

3. The apparatus of claim 2, wherein the first mode circuitry comprises a low-noise amplifier configured to amplify signals within a first frequency band, the second mode circuitry comprises a low-noise amplifier configured to amplify signals within a second frequency band, and the circuitry coupled to the secondary winding comprises a down-conversion mixer.

4. The apparatus of claim 2, wherein the first mode circuitry comprises a driver amplifier configured to transmit signals within a first frequency band, the second mode circuitry comprises a driver amplifier configured to transmit signals within a second frequency band, and the circuitry coupled to the secondary winding comprises an up-conversion mixer.

5. The apparatus of claim 1, further comprising:
a second switch coupling the second primary winding to the AC ground node, wherein the second switch is configured to be closed when the second mode circuitry is active.

6. The apparatus of claim 1, further comprising a third winding coupled to the AC ground node, wherein the secondary winding is further mutually coupled to the third winding.

7. The apparatus of claim 2, further comprising an auxiliary second portion coupling the second portion to the AC ground node.

8. The apparatus of claim 2, the circuitry coupled to the secondary winding comprising a low-noise amplifier having a differential input.

9. The apparatus of claim 8, the first mode circuitry comprising a filter for passing a first band, the second mode circuitry comprising a filter for passing a second band.

10. The apparatus of claim 8, the first mode circuitry comprising a matching network for passing a first band, the second mode circuitry comprising a matching network for passing a second band.

11. An apparatus comprising:
a first primary winding coupled to an auxiliary intermediate node;
a second primary winding coupled to the auxiliary intermediate node and further to an AC ground node;
a secondary winding mutually coupled to the first and second primary windings;
first mode circuitry coupled to the first primary winding;
second mode circuitry coupled to the second primary winding; and
circuitry coupled to the secondary winding configured to process signals associated with the first mode circuitry and the second mode circuitry.

12. The apparatus of claim 11, wherein the first mode circuitry comprises a low-noise amplifier configured to amplify signals within a first frequency band, the second mode circuitry comprises a low-noise amplifier configured to amplify signals within a second frequency band, and the circuitry coupled to the secondary winding comprises a down-conversion mixer.

13. The apparatus of claim 11, wherein the first mode circuitry comprises a driver amplifier configured to transmit signals within a first frequency band, the second mode circuitry comprises a driver amplifier configured to transmit signals within a second frequency band, and the circuitry coupled to the secondary winding comprises an up-conversion mixer.

14. An apparatus comprising:
a primary winding comprising first and second terminals;
first mode circuitry coupled to the first terminal of the primary winding;
second mode circuitry coupled to the second terminal of the primary winding;
a secondary winding mutually coupled to the primary winding;
circuitry coupled to the secondary winding to process signals associated with the first mode circuitry and the second mode circuitry;
a first switch configured to couple the first terminal of the primary winding to an AC ground node when the second mode circuitry is active; and
a second switch configured to couple the second terminal of the primary winding to an AC ground node when the first mode circuitry is active.

15. The apparatus of claim 14, the circuitry coupled to the secondary winding comprising a low-noise amplifier.

16. The apparatus of claim 14, the circuitry coupled to the secondary winding comprising a down-conversion mixer, the first mode circuitry comprising a low-noise amplifier for a first band, and the second mode circuitry comprising a low-noise amplifier for a second band.

17. The apparatus of claim 14, the circuitry coupled to the secondary winding comprising an up-conversion mixer, the first mode circuitry comprising a driver amplifier for a first band, and the second mode circuitry comprising a driver amplifier for a second band.

18. An apparatus comprising:
first mode circuitry;
second mode circuitry;
means for processing signals associated with the first mode circuitry and the second mode circuitry, the means for processing signals associated with the first mode circuitry being shared with the means for processing signals associated with the second mode circuitry; and
means for mutually coupling a signal of the first mode circuitry and the second mode circuitry to the means for processing signals.

19. The apparatus of claim 18, the means for processing signals comprising a down-conversion mixer, the first mode circuitry comprising a low-noise amplifier for a first band, and the second mode circuitry comprising a low-noise amplifier for a second band.

20. The apparatus of claim 18, the means for processing comprising an up-conversion mixer, the first mode circuitry comprising a driver amplifier for a first band, and the second mode circuitry comprising a driver amplifier for a second band.

21. The apparatus of claim 18, wherein the means for mutually coupling comprises first means for mutually coupling the first mode circuitry to the means for processing signals, and wherein the means for mutually coupling further comprises second means for mutually coupling the second mode circuitry to the means for processing signals.

22. The apparatus of claim 18, wherein the means for mutually coupling comprises at least a first primary winding and a second primary winding.

23. The apparatus of claim 22, further comprising means for selectively coupling the first primary winding or the second primary winding to AC ground.

* * * * *